Figure 1:
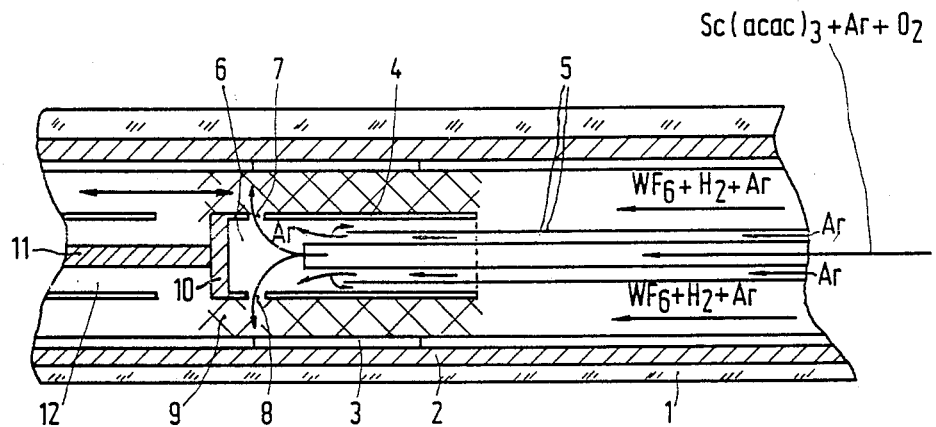

United States Patent [19]

Gärtner et al.

[11] Patent Number: 4,965,090
[45] Date of Patent: Oct. 23, 1990

[54] METHOD FOR THE PLASMA-ACTIVATED REACTIVE DEPOSITION OF ELECTRICALLY CONDUCTIVE MULTICOMPONENT MATERIAL FROM A GAS PHASE

[75] Inventors: Georg F. Gärtner, Aachen; Peter A. Janiel, Würselen; Hans-Jürgen Lydtin, Stolberg, all of Fed. Rep. of Germany

[73] Assignee: U.S. Philips Corporation, New York, N.Y.

[21] Appl. No.: 293,168

[22] Filed: Jan. 4, 1989

[30] Foreign Application Priority Data

Jan. 13, 1988 [DE] Fed. Rep. of Germany ....... 3800712

[51] Int. Cl.$^5$ ................. C23C 16/08; C23C 16/50; C23C 16/56
[52] U.S. Cl. ........................ 427/39; 427/38; 427/230; 427/237; 427/238; 427/255.2
[58] Field of Search .............. 427/38, 39, 230, 237, 427/238, 255.2

[56] References Cited

U.S. PATENT DOCUMENTS 4,713,259 12/1987 Gärtner et al. .............. 427/39

Primary Examiner—Norman Morgenstern
Assistant Examiner—Margaret Bueker
Attorney, Agent, or Firm—Norman N. Spain

[57] ABSTRACT

Electrically conductive multicomponent material is deposited on a tubular substrate (3) by means of a PCVD method. A plasma (9) is produced between an inner electrode (13) and an outer electrode, one of which is tubular and serves as a substrate. In order to obtain multicomponent material of the desired composition, the composition of the gas phase is changed as a function of time and/or place. In particular when metal-organic starting compounds are used, PCVD of many single layers together with an intermittent, for example, Ar/O$_2$ plasma intermediate treatment yields an efficient removal of undesired carbon or fluorine from the deposited multicomponent material already during its manufacture.

14 Claims, 1 Drawing Sheet

METHOD FOR THE PLASMA-ACTIVATED REACTIVE DEPOSITION OF ELECTRICALLY CONDUCTIVE MULTICOMPONENT MATERIAL FROM A GAS PHASE

The invention relates to a PCVD method, i.e. a method for the plasma-activated reactive deposition of electrically conductive multicomponent material from a flowing gas phase on a tubular substrate, in which the plasma is produced between an inner electrode and an outer electrode, one of which is tubular and serves as a substrate.

A similar method is known from EP-A 204356. In the method described therein a localized glow-discharge zone is produced between the inner electrode and the outer electrode, said zone being maintained during the deposition. In the method, the inner electrode is reciprocated in a controlled manner relative to the outer electrode and measures are taken to prevent the formation of electrically conductive layers on electrically insulating constructional parts in the reaction space. The temperature in the substrate area is kept constant at a low value at which the thermal deposition rate is low in comparison with the deposition rate in the case of glow discharge.

Using the known method, for example, self-supporting electrically conductive thoriated tungsten cylinders are produced. The concentration of thorium oxide in tungsten ranges between 0.5 and 10% by weight. The method can suitably be used to dope tungsten or other refractory metals with actinides and their oxides as well as with scandium, yttrium and rare earth metals and their oxides. Instead of self-supporting cylinders, coatings on existing structures may also be manufactured in accordance with the known method.

Investigations which have led to the present invention have shown that metalorganic starting compounds can readily be used at molar ratios of W: Th (or another element of the III B group of the periodic system) in the range from approximately 20 : 1, without too much undesired carbon or undesired flourine being deposited, however, that this is no longer the case when the molar ratio is changed by one order of magnitude and when instead of a doping a mixture is formed, for example, of W : Sc in the molar ratio of 2 : 1 or 3 : 1.

A practical application in this field is the coating of I-cathodes, i.e. impregnated Ba,Sr-dispenser thermionic cathodes, with a layer of W +13% by weight of $Sc_2O_3$ by means of PCVD, which operation should result in an improved scandate cathode having a high electron emission and resistance against ion bombardement (100% recovery). In analogy with the manufacture of Th/W cathodes by PCVD, Sc/W materials which may also be used as scandium-coated W thermionic cathodes were manufactured by PCVD, Sc-$\beta$-diketonates being used as the starting compounds. When the Sc concentration was increased to 10% by weight or more, which corresponds to a molar ratio between W and Sc of 2.5 : 1, the phases $W_2C$ or $W_2(C, O)$ and $ScF_3$ were obtained instead of W and $ScO_3$ after the PCVD deposition operation.

It is an object of the invention to take measures which enable the desired solid phases, i.e. multicomponent material having the desired composition, to be obtained by PCVD.

This object is achieved in accordance with the invention, in that in a method of the type described in the opening paragraph the composition of the gas phase is changed as a function of time and/or place.

Volatile metal compounds, in particular metal halogenides and metalorganic compounds, are preferably added to the flowing gas phase as the starting material for the multicomponent material. Fluorine-free metalorganic compounds are preferred; this will be explained in more detail hereinbelow.

In the method in accordance with the invention, preferably, a periodic reciprocating movement of the inner electrode or outer electrode is carried out, the stroke of this movement being larger than the expansion of the deposition profile obtained in the static condition, preferably, a multiple thereof.

The change of the composition of the gas as a function of time is preferably obtained in that intermediate plasma treatments are carried out intermittently.

In this process, preferably, an inert gas is used together with an oxidizing gas which does not contain carbon nor fluorine. In particular, $Ar/O_2$ or $Ar/H_2O$, $Ar/NO_2$ and/or, in succession, $Ar/H_2$ and Ar are used.

Preferably, a single layer of multicomponent material having a thickness of maximally 0.5 $\mu$m, in particular less than 0.1 $\mu$m, is deposited each time between two plasma treatments.

The local change in the gas-phase composition is preferably attained in that single gas components, for example $WF_6+ H_2 (+A_r)$ on the one hand and Ar + metalorganic compounds + oxidizing gas on the other hand are introduced into separated plasma zones through physically separated gas inlets.

In this respect, the distance between two gas inlets for two different components of the gas phase, the process parameters being predetermined, should advantageously be adjusted so that in the static condition the deposition maxima are equal for both components.

It is particularly advantageous to carry out a deposition of two or more components simultaneously, in which the individual components of the gas phase are introduced into separated plasma zones through physically separated gas inlets, and in which during the periodical reciprocating movement of the inner or outer electrode (i. e. during the movement of the electrodes relative to each other which leads to a periodical plasma displacement) intermittent intermediate plasma-treatments are carried out. The distance between the gas inlets is preferably adjusted so that the deposition maxima for the two main components are equal to each other in the static condition.

Due to the fact that, as already stated, fluorine-free metalorganic starting compounds are added to the flowing gas phase, the incorporation of fluorine or fluorine compounds into the multicomponent material is reduced. This measure is based on investigations in which scandium(trifluoroacetylacetonate)$_3$=Sc(tfa)$_3$ or scandium(hexafluoroacetylacetonate)$_3$=Sc(hfa)$_3$=Sc($C_5H$-$F_6O_2$)$_3$were first used as the Sc souce, predominantly because of their relatively high vapour pressure, and in which Ar was used as the carrier gas which flowed into the reactor through an evaporator filled with powdered starting material. However, to obtain $Sc_2O_3$ instead of $ScF_3$ by means of PCVD, an evaporator filled with powdered starting material. However, to obtain $Sc_2O_3$ instead of $ScF_3$ by means of PCVD, an oxidizing gas was added: $N_2O$, $CO_2$, $H_2O$ vapour in argon (=wet argon) and $O_2$ which were already introduced with the Ar carrier gas through the evaporator were investigated. However, the result was again $ScF_3$ deposition by means of PCVD (wall temperatures of generally approximately 370° C., investigated range 250° to 660° C.). Only in the case of Sc(tfa)₃ in very wet argon (washing bottle heated to 40° C.) + 10 sccm of $O_2$ and at a the pressure of 25 mbar the sofar unknown Sc phase $Sc_{0.1}WO_3$=scandium-tungstate was first obtained in addition to $ScF_3$.

Moreover, in the case of metalorganic starting compounds such as, for example, $ScC_{15}H_{12}F_9O_6$=Sc (tfa)₃, the codeposition of a few % of C in the PCVD operation can hardly be avoided. In the case of the above-mentioned gas mixture, $ScF_3$ is the thermodynamic stable Sc phase at temperatures below 900 K, while $Sc_2O_3$ or $Sc_6WO_{12}$ are more stable only at T ≧ 1000 K, but, at such high substrate temperatures the advantages of the PCVD method, for example the uniformity, are lost.

For this reason, fluorine-free scandium-(acetylacetonate)₃=$Sc(C_5H_7O_2)_3$=Sc(aa)₃ was selected as the new Sc starting compound. Together with wet Ar or dry Ar and $O_2$ as an oxidizing gas, $Sc_2O_3$ and/or scandium tungstate were first obtained in this way ($Sc_{0.1}WO_3$, $Sc_{0.2}W_{0.85}O_3$, $Sc_6WO_{12}$). However, carbon in the form of W-carbide is still present in the deposited solid. $ScF_3$ is still found in the region of the gas inlet. The fact that in particular the oxygen-containing phases are formed in the plasma becomes plausible in that at this stage the Sc compound is free of fluorine and the fluorine liberated from $WF_6$ + $H_2$ is drawn off as stable HF in the gas. The likelihood of F-capture by Sc is reduced.

Since, for example, in the case of an I-cathode comprising PCVD-$Sc_2O_3$ + a W-covering layer a carbon-co-deposition in the covering layer is undesired, the carbon was again removed by means of an intermittent intermediate plasma treatment from the thin single layer which has just been deposited, and the entire covering layer was formed from a sequence of several to a multitude of thin single layers which were each subjected to a plasma treatment.

In the case of a periodically reciprocated plasma, Sc, W (and O, F and C) are for this purpose deposited from the above-described in one direction, in accordance with the invention. At the turning point the gases introduced are diverted to a bypass and only Ar and $O_2$ (for example 270 sccm of Ar and 55 sccm of $O_2$) are led through the reactor. Thus, during the return movement and Ar/$O_2$ plasma is burnt and C is removed through the gas phase as CO/$CO_2$. If the concentration maxima of Sc, W and C are locally different in the PCVD deposition operation, the direction of coating and of movement of the anode in the plasma intermediate treatment are, for example, selected such that coating takes place when the anode moves in the direction of the gas flow (in practice counter-gravitationally) and an intermediate plasma treatment takes place in the opposite direction. If necessary, a sequence of intermediate treatments, using, for example, Ar/$O_2$ plasma, Ar/$H_2$ plasma and Ar plasma are carried out, for example in successive half cycles (corresponding to a direction of the anode movement). Moreover, if neccessary, the speed of the anode movement during the intermediate plasma treatment is changed or in the intermediate treatment a time of exposure to the plasma is selected which differs from that of the individual PCVD interval.

By means of SAM analysis (SAM=Scanning Auger Microscopy) of the single layer (including sputtering to obtain a concentration depth profile) it was found that the maximum Sc concentration occurs at the beginning of the glow discharge in the direction of flow (=the tip of the anode), W is deposited, predominantly, in the centre (thickened portion of the anode) and C is deposited towards the end of the plasma zone (in the direction of the gas inlet =anode supply sleeves) (but also together with Sc). If the PCVD-deposition during the anode movement takes place in a direction opposite to the direction of flow, the highest C concentration is obtained in the surface area of that moment, and a satisfactory C decomposition is obtained in the Ar/$O_2$ plasma treatment during the return movement in the direction of flow. X-ray diffration recordings of the layers thus manufactured showed no trace of carbon-containing phases. SAM profiles show that the C content of from approximately 30 to 40 mol% could be reduced to less than 1%, without making use of the above-described additional improvement (=plasma treatment in a direction opposite to the direction of flow).

In this respect it is to be noted that in the Th/W-PCVD method a similar treatment was carried out to prevent the information of thin intermediate layers of $ThF_4$ which are formed outside the plasma by thermal CVD, and to prevent a further incorporation of F in the PCVD layer, as well as to obtain layers which were again free of fluorine. For this purpose, the layer deposited in a direction of movement was subjected to a pure Ar glow discharge in a direction opposed to that of the anode movement. SAM investigations showed that the layers thus manufactured were free of fluorine, and that the desired presence of carbon in the layers was preserved.

A further measure in accordance with the invention, aimed at obviating the W-carbide formation already in the PCVD operation consists in that a first W deposition and subsequently a Sc deposition (i.e. $Sc_2O_3$) are carried out in separate plasma zones, in the direction of flow, so that C-containing volatile reaction products can no longer react with W. To this end, two different gas inlet and anode constructions can be used which will be explained by means of a drawing, in which FIGS. 1 and 2 each are diagrammatic sectional views of a part of two different PCVD arrangements.

FIG. 1 shows a reactor tube comprising an outher quartz tube 1 in which a high-grade steel cylinder 2 is arranged, and a substrate cylinder 3 arranged in the high-grade steel cylinder. An anode head in the form of a tubular anode 4 is arranged inside the substrate cylinder, an Sc starting compound with Ar carrier gas and $O_2$ flowing through a fixed quartz tube 5 into a cavity 6 in the tubular anode, as indicated by arrows, and flowing out into a plasma zone, in this case a glow-discharge zone 9, through apertures 7 and 8 on the supply side, in which plasma zone it decomposes and is deposited as Sc-oxide (or Sc-tungstate) on the substrate cylinder 3. During the deposition, the tubular anode 4, which is connected to a movable rod 11 via a holder 10, is reciprocated, which is indicated by a double arrow. The rod is surrounded by a dead volume 12, preventing depositions in undesired places.

To prevent Sc($F_3$) from being deposited already in the interior of the tubular anode, which is heated by the plasma, additional Ar is fed as a cleaning gas into the tubular anode through the tube 5 having a two-tube construction (one quartz tube arranged inside the other), or the tubular anode is subjected to additional cooling (in a manner not shown).

$WF_6 + H_2 + Ar$ flows into the reactor tube from the side remote from the anode, and W is deposited already at the beginning of the discharge zone.

Figure 2:
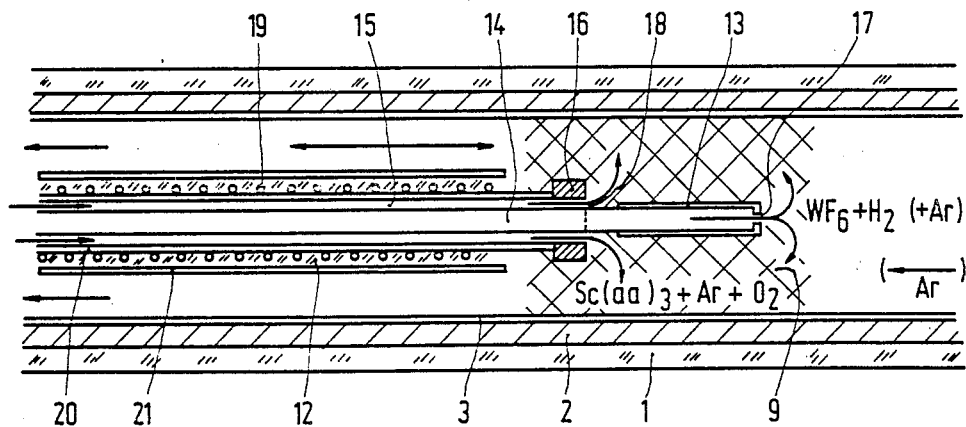

FIG. 2 shows a double-walled tubular anode having an anode head 13, in which both components are introduced separately, the components being separated by an inner tube 14 and a tubular cladding 15 having a thickened portion 16, $WF_6 + H_2$ (+Ar) and $Sc(aa)_3 + Ar + O_2$ being introduced into the plasma zone 9 through separate apertures 17 and 18, such that Sc oxide is deposited first in the exhaust direction of suction (supply side) and W is deposited in the region of the anode tip.

The tubular cladding 15 is surrounded by an anode heating 19, an $Al_2O_3$ insulation 20 and an anode supply sleeve 21 of graphite.

For this reason, an additional thickened portion in the region of the anode tip at numeral 17 is recommendable (not shown). If the exhaust direction is oriented towards the side facing away from the anode, the supply of $WF_6$ and $H_2$ are then introduced through the tubular cladding 15 and emerge in the plasma zone; $Sc(aa)_3 + Ar + O_2$ flow through the central supply tube 14 and emerge at the anode tip, such that C containing molecular residue is immediately drawn off the edge of the plasma zone and no more W carbide can be deposited through the plasma.

The temperature of the tubular walls supplying the $Sc(aa)_3$ must be kept at evaporation temperature (for example 165° C.), for which purpose additional heater windings are provided.

In a variant of the arrangement of FIG. 2, the distance between the gas inlets 17 and 18 is adjusted in such a way that the maxima of the concentration profiles attained in the static condition are the same for each of the two metal components, in this case W and Sc. Consequently, in the case of the dynamic deposition using reciprocating plasma the generally strong undesired variation in concentration across the layer thickness can be considerably reduced so that uniformity of the PCVD layer is obtained not only in the axial direction but also in the radial direction across the layer thickness.

If necessary, the method carried out by means of the arrangement of FIG. 2 can also be performed using an intermittent, for example $Ar/O_2$ plasma intermediate treatment so that a further carbon residue reduction is obtained.

The method in accordance with the invention can be carried out not only by using $Sc(aa)_3 + O_2 + WF_6 + H_2$ but also by using other multicomponent systems, in which, for example, $\beta$ diketonates of the scandium group (III B-group) and fluorides of the transition or refractory metals are used as the starting compounds or it may alternatively be used, for example, in the PCVD deposition of rare earth metal-$\beta$-diketonates, alkaline earth-$\beta$-diketonates and transition metal/Cu-$\beta$-diketonates or other metalorganic compounds of these elements to retain the corresponding pure oxidic solid phases.

To preclude output losses when diverting the reactive gases to a bypass, the method in accordance with the invention is advantageously carried out in two twin devices in which deposition and plasma intermediate treatment are carried out alternately, and the reactive gases are switched from one reactor to the other.

We claim:

1. A method for the plasma-activated reactive deposition of electrically conductive multicomponent material from a flowing gas phase on a tubular substrate, in which the plasma is produced between an inner electrode and an outer electrode, one of which electrodes is tubular and serves as a substrate, characterized in that the composition of the gas phase is changed as a function of time and/or place and that a periodical reciprocating movement of one of said electrodes is carried out and the stroke of the reciprocating movement is a multiple of the expansion of the deposition profile obtained when the electrodes in relation to each other are in a static condition.

2. A method for the plasma-activated reactive deposition of electrically conductive multicomponent material from a flowing gas phase on a tubular substrate, in which the plasma is produced between an inner electrode and an outer electrode, one of which electrodes is tubular and serves as a substrate, characterized in that the composition of the gas phase is changed as a function of time and/or place and intermediate plasma treatments are carried out intermittently.

3. A method for the plasma-activated reactive deposition of electrically conductive multicomponent material from a flowing gas phase on a tubular substrate, in which the plasma is produced between an inner electrode as an outer electrode, one of which electrodes is tubular and serves as a substrate, characterized in that the composition of the gas phase is changed as a function of time and/or place and in which the deposition and a plasma intermediate treatment are carried out alternatively in two twin devices, the reactive gasses present in the gas phase being switched from one of said devices to the other.

4. A method as claimed in claim 1, characterized in that volatile metal compounds are added to the flowing gas phase as the starting material for the multicomponent material.

5. A method as claimed in claim 4, characterized in that metal halogenides and metalorganic compounds are added to the flowing gas phase as components.

6. A method as claimed in claim 4, characterized in that fluorine-free metalorganic compounds are added to the flowing gas phase.

7. A method as claimed in claim 2, characterized in that in the case of the intermediate plasma treatment an inert gas is used together with an oxidizing gas which does not contain carbon or fluorine.

8. A method as claimed in claim 7, characterized in that in the intermediate plasma treatment $Ar/O_2$ or $Ar/H_2O$, $Ar/N_2O$ and/or in succession $Ar/H_2$ and Ar are used.

9. A method as claimed in claim 2, characterized in that a single layer of a multicomponent material having a thickness of at most 0.5 $\mu m$ is deposited each time between two plasma treatments.

10. A method as claimed in claim 9, characterized in that each time a single layer having a thickness smaller than 0.1 $\mu m$ is deposited.

11. A method as claimed in claim 1, characterized in that single components of the gas phase are introduced into separate plasma zones through physically separated gas inlets.

12. A method as claimed in claim 11, characterized in that in the case of predetermined process parameters, the distance between two gas inlets for two different components of the gas phase is adjusted so that the deposition maxima of both components are equal to each other in the static condition.

13. A method as claimed in claim 2, characterized in that two or more components are deposited simultaneously, the single components of the gas phase being introduced into separate plasma zones through physically separated gas inlets, and intermittent plasma intermediate treatments being carried out during the periodic reciprocating movement of the inner and outer electrode.

14. A method as claimed in claim 13, characterized in that the distance between the gas inlets is adjusted so that in the static condition the deposition maxima are equal for both main components.

* * * * *